(12) United States Patent
So

(10) Patent No.: US 11,606,931 B2
(45) Date of Patent: Mar. 21, 2023

(54) ANIMAL TRAINING DEVICE

(71) Applicant: Dogtra co., Ltd., Incheon (KR)

(72) Inventor: Min Kyun So, Seoul (KR)

(73) Assignee: Dogtra co., Ltd., Incheon (KR)

( * ) Notice: Subject to any disclaimer, the term of this patent is extended or adjusted under 35 U.S.C. 154(b) by 177 days.

(21) Appl. No.: 17/150,251

(22) Filed: Jan. 15, 2021

(65) Prior Publication Data

US 2021/0219523 A1 Jul. 22, 2021

(30) Foreign Application Priority Data

Jan. 17, 2020 (KR) ........................ 10-2020-0006493

(51) Int. Cl.
| | | |
|---|---|---|
| *A01K 15/02* | (2006.01) | |
| *A01K 27/00* | (2006.01) | |
| *H05K 1/14* | (2006.01) | |
| *H05K 1/18* | (2006.01) | |
| *H02J 7/00* | (2006.01) | |
| *H01R 13/62* | (2006.01) | |

(52) U.S. Cl.
CPC .......... *A01K 15/022* (2013.01); *A01K 27/001* (2013.01); *H01R 13/6205* (2013.01); *H02J 7/0042* (2013.01); *H05K 1/148* (2013.01); *H05K 1/189* (2013.01); *H05K 2201/1003* (2013.01); *H05K 2201/10037* (2013.01); *H05K 2201/10098* (2013.01)

(58) Field of Classification Search
CPC .... A01K 15/022; A01K 15/021; A01K 15/02; A01K 15/00
See application file for complete search history.

(56) References Cited

U.S. PATENT DOCUMENTS

| | | | | |
|---|---|---|---|---|
| 4,887,549 | A | * 12/1989 | Powell ................. | A01K 15/022 |
| | | | | 119/908 |
| 2008/0061990 | A1* | 3/2008 | Milnes ................. | A01K 15/023 |
| | | | | 342/357.55 |
| 2013/0233252 | A1* | 9/2013 | Bellon ................. | A01K 27/009 |
| | | | | 119/720 |
| 2014/0196673 | A1 | 7/2014 | Menkes et al. | |

(Continued)

FOREIGN PATENT DOCUMENTS

KR 10-0123405 B1 11/1997

OTHER PUBLICATIONS

Office Action for the Korean Patent Application No. 10-2020-0006493 issued by the Korean Patent Office dated Aug. 26, 2021.

*Primary Examiner* — Kristen C Hayes
(74) *Attorney, Agent, or Firm* — IP & T Group LLP

(57) ABSTRACT

Animal training device disclosed. The animal training device for being worn on an animal being trained and for training by use of stimulus includes a device body, being worn on a neck of the animal being trained by a fastener, wherein the device body comprises a plurality of module bases in which a plurality of unit modules are respectively disposed, a body base having a plurality of compartments in which the plurality of unit modules are respectively disposed and at least one module connecting portion connecting two compartment, a plurality of module covers being respectively disposed on the plurality of module bases to form a space, PCB portion, being disposed in the space, and a contact terminal, being disposed on a part of the plurality of module covers.

11 Claims, 8 Drawing Sheets

(56) References Cited

U.S. PATENT DOCUMENTS

| | | |
|---|---|---|
| 2015/0122199 A1 | 5/2015 | Koplin |
| 2018/0055010 A1* | 3/2018 | Oostdik ............... A01K 27/001 |
| 2018/0110205 A1* | 4/2018 | Czarnecky ........... A01K 15/021 |
| 2018/0125035 A1* | 5/2018 | Bellon ................. A01K 27/001 |

* cited by examiner

[FIG. 1]
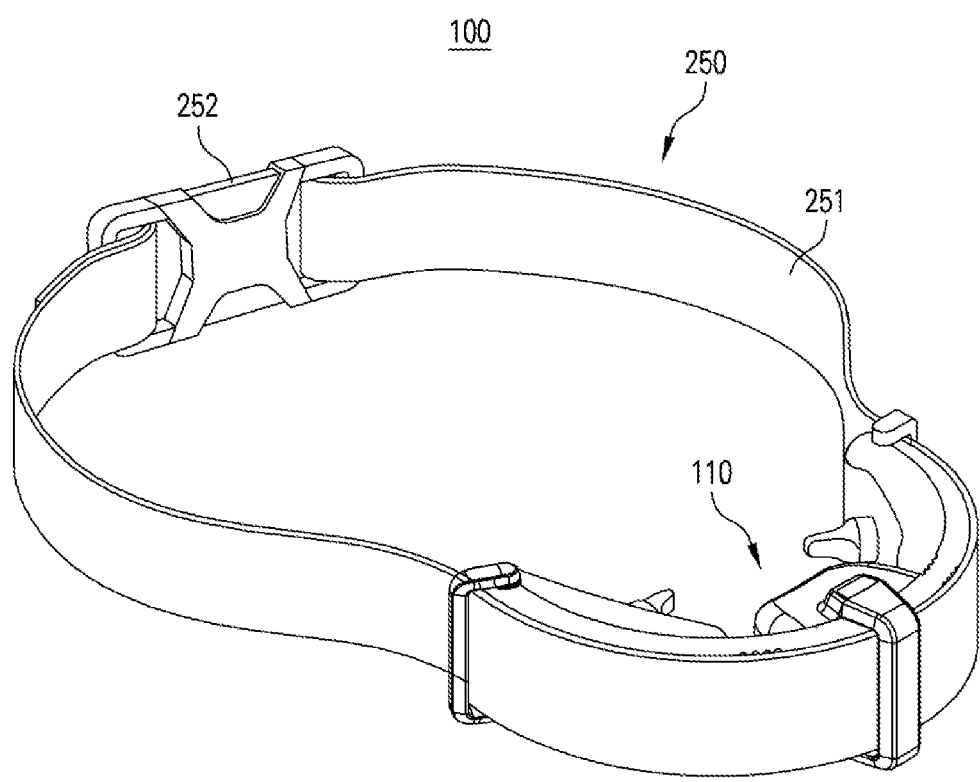

[FIG. 2]
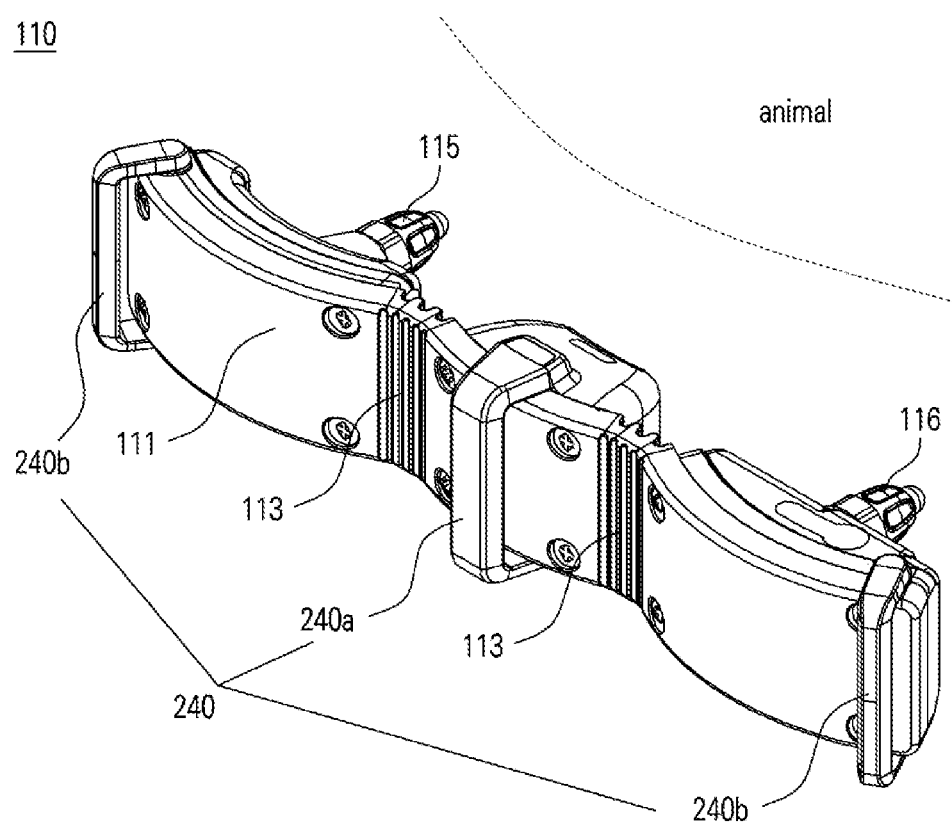

[FIG. 3]
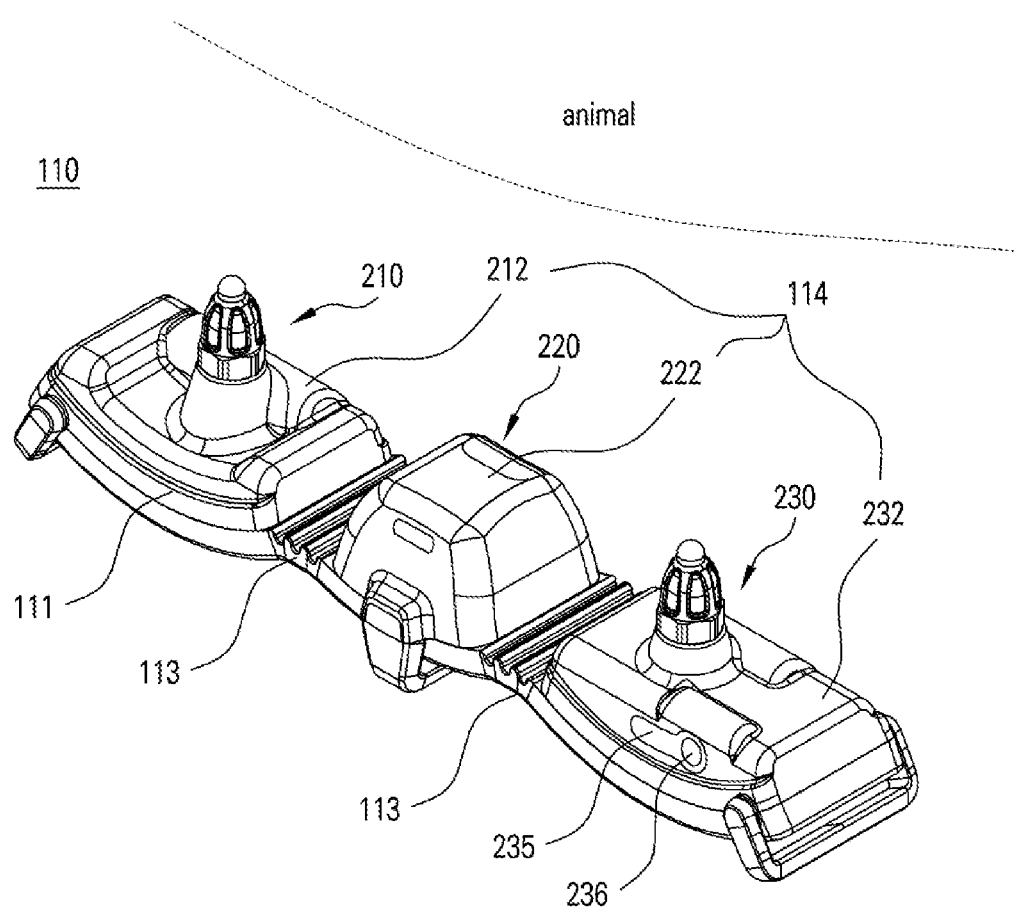

[FIG. 4]
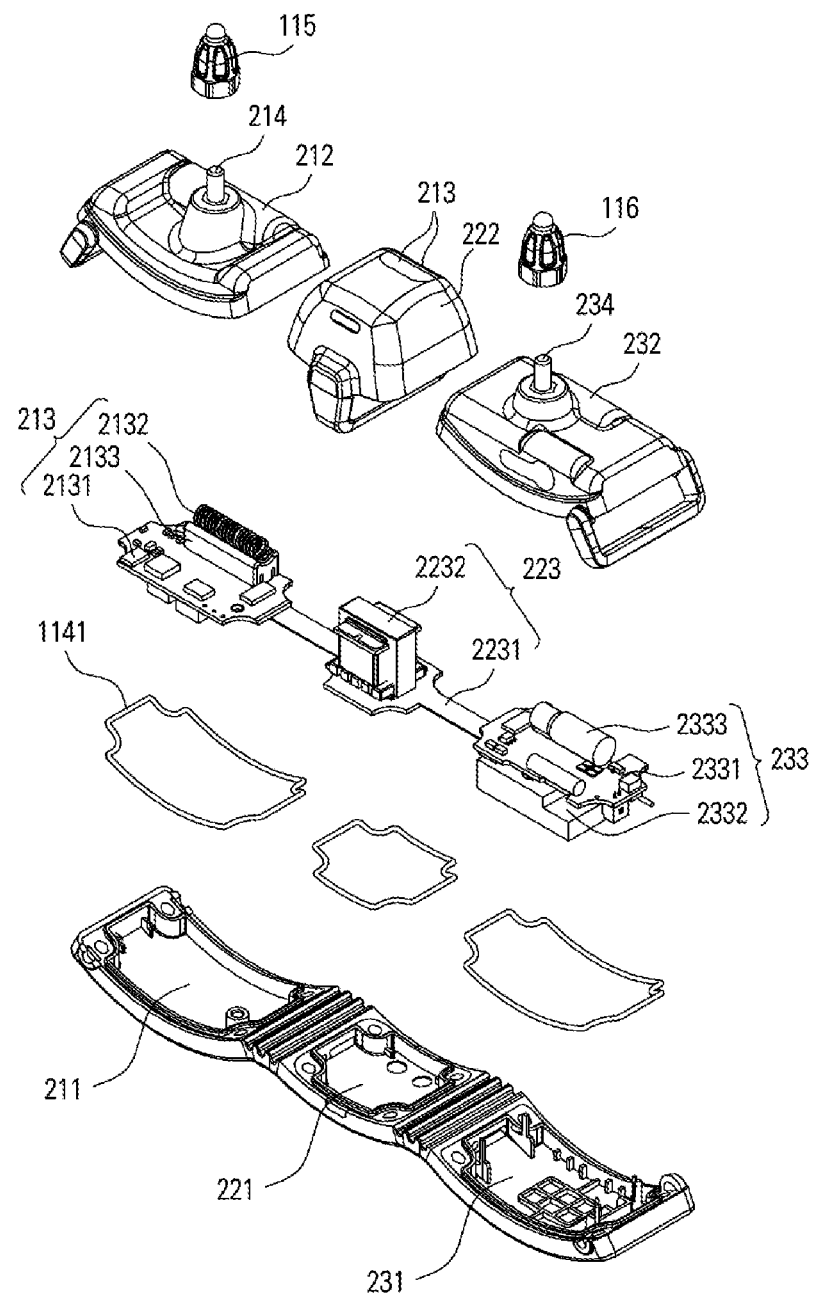

[FIG. 5]
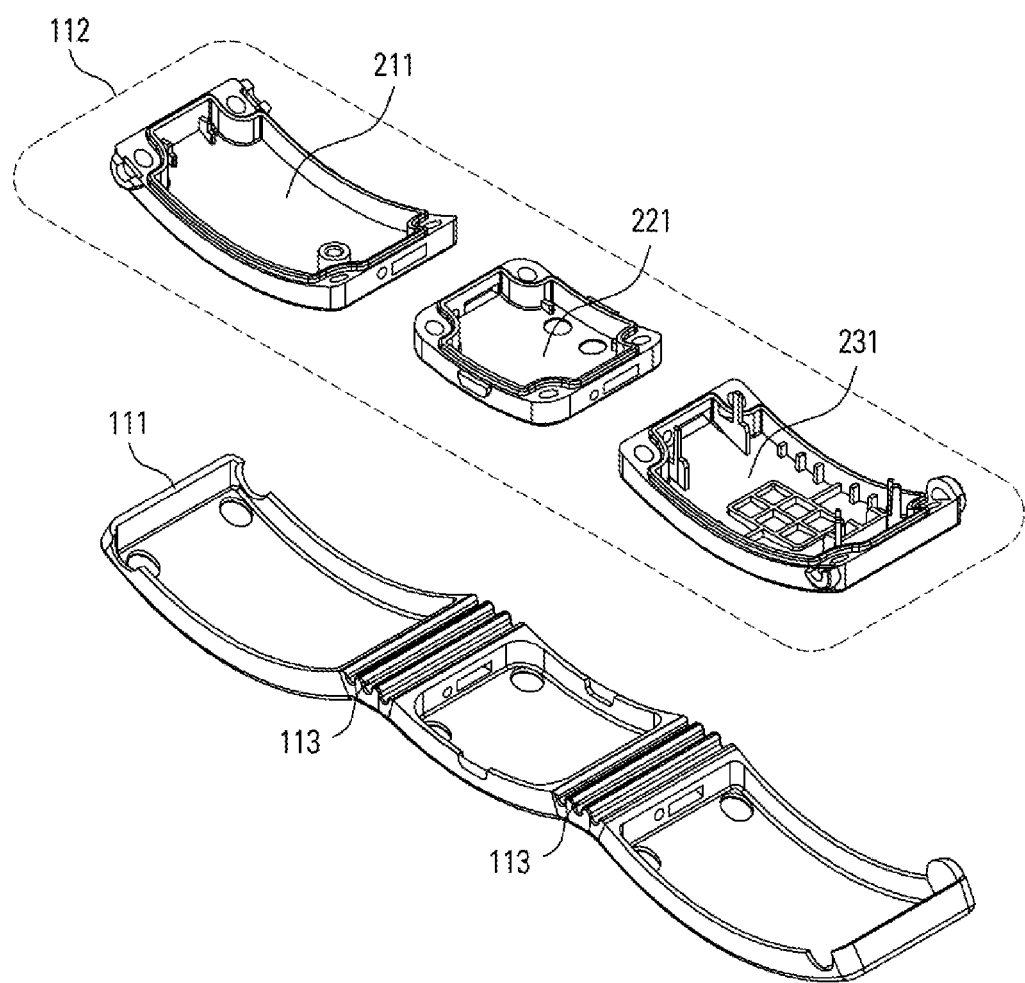

[FIG. 6]
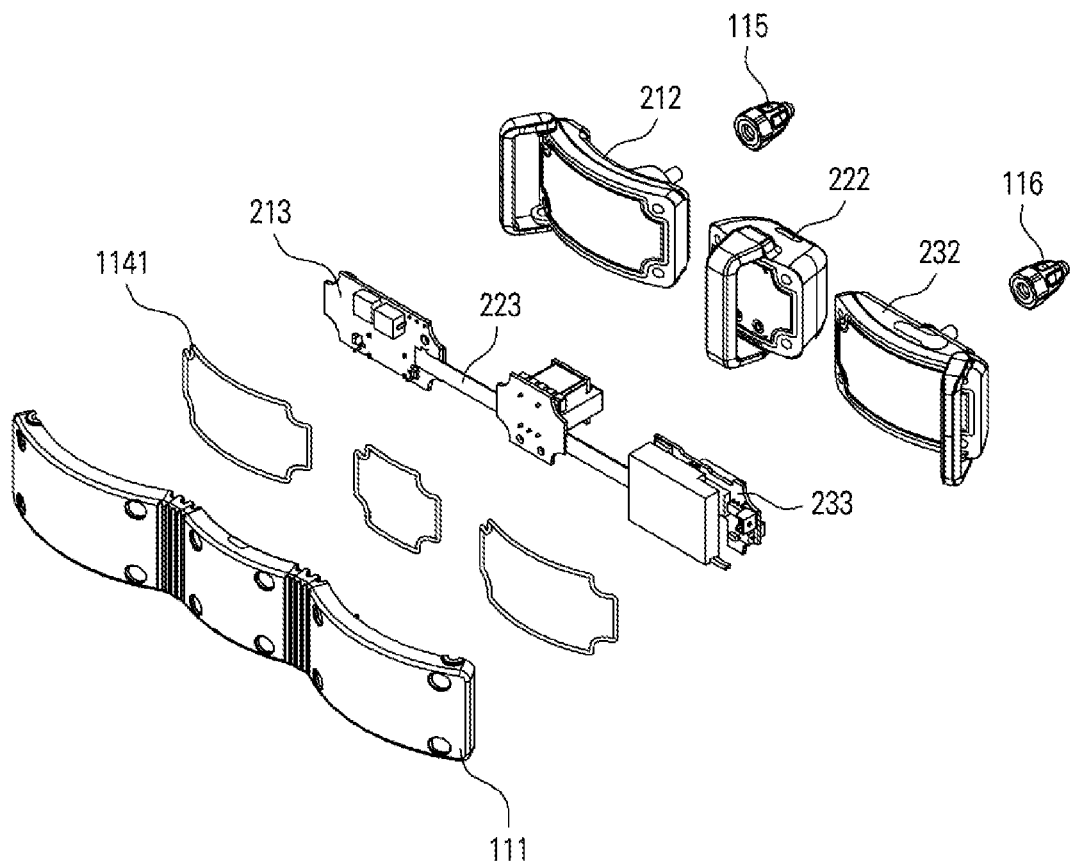

[FIG. 7]
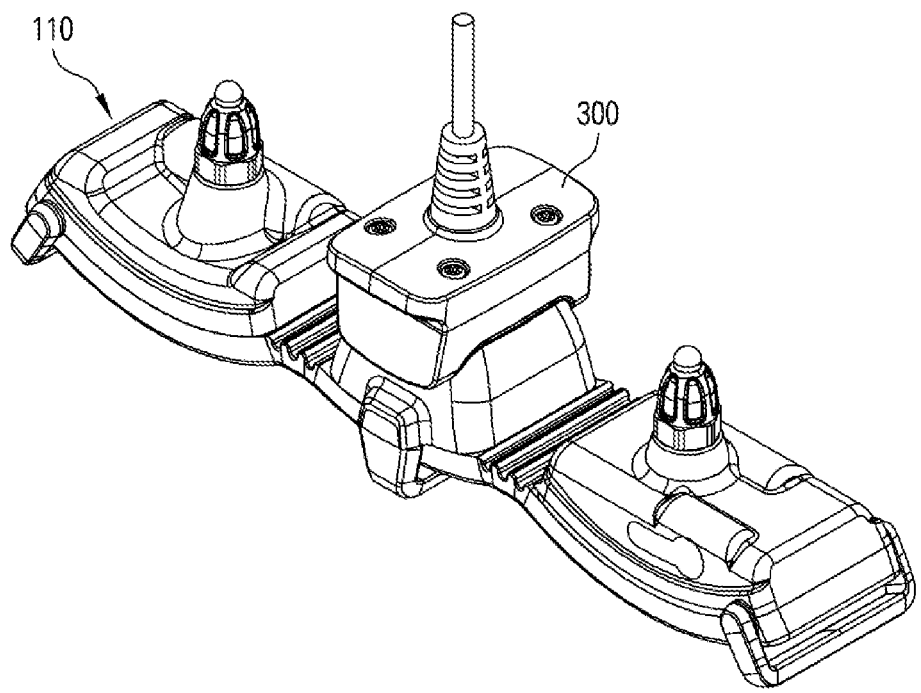

[FIG. 8]
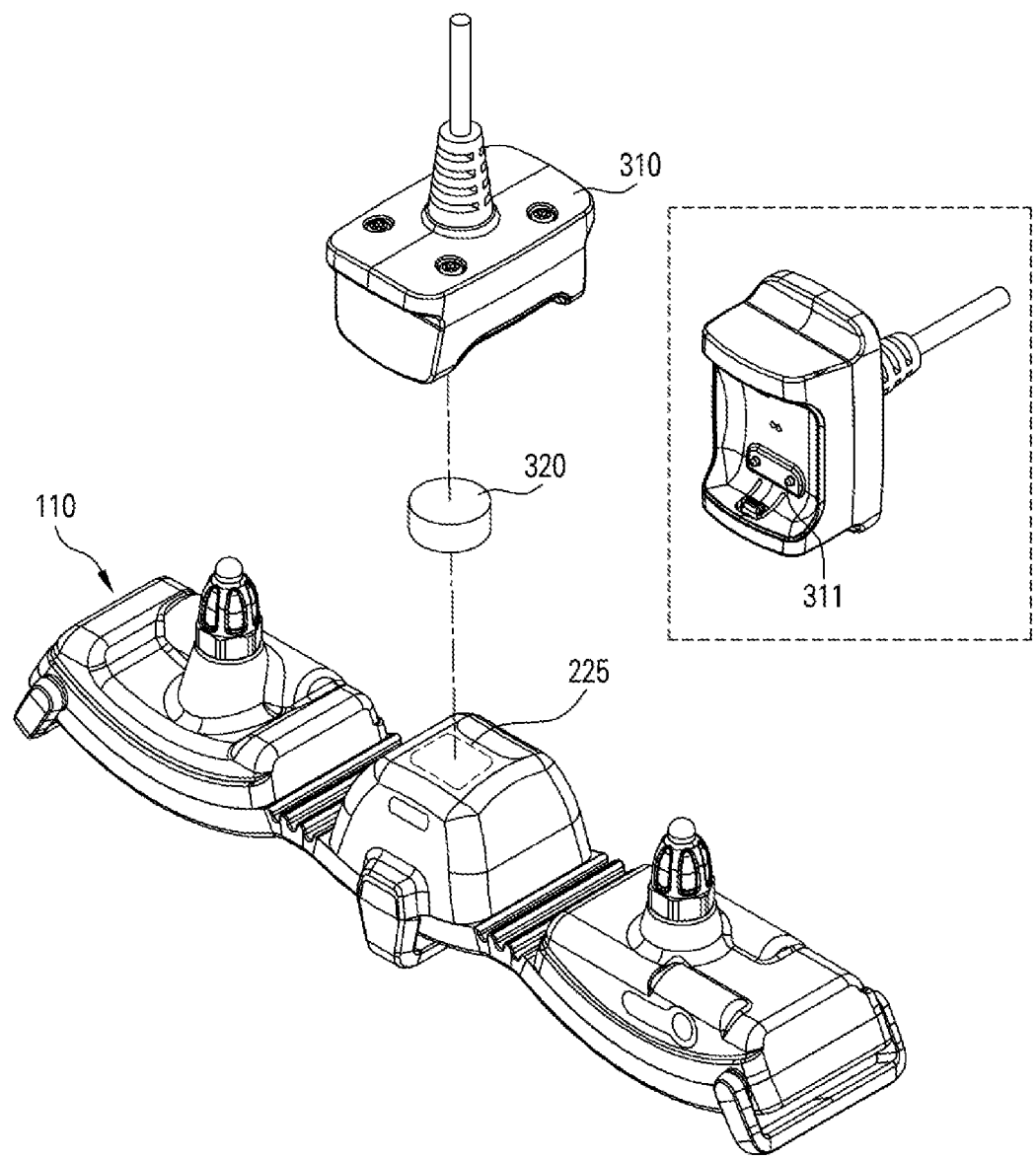

ANIMAL TRAINING DEVICE

CROSS-REFERENCE TO RELATED APPLICATIONS

This patent application claims priority to Korean Patent Application No. 10-2020-0006493, filed on Jan. 17, 2020, the entire disclosure of which is incorporated herein by reference.

FIELD OF INVENTION

The present invention relates to animal training device.

RELATED ART

Animal training devices have been developed and used as a means for correcting the behavior of animals (for example, dogs). For example, a technology has been developed to suppress a dog barking by applying stimulus (electric stimulus or vibrations) to a dog in a collar-type device mounted on the dog's neck when a dog barking is detected by a sensor. Alternative techniques have been also developed in which a user (a trainer, a dog owner, etc.) operates a remote controller to send a command to a collar-type device mounted on a dog's neck to apply stimulus to a dog when the dog barks, goes out of the designated area, or attacks a human.

By using these animal training devices, it is possible to correct the behavior of the animal and to learn the desired behavior.

The optimal wearing form of the collar-type device mounted on an animal can vary according to the type of the animal being trained. In addition, even if the animal being trained are of the same species (e.g., dogs), there are various types of hunting dogs, military dogs, pet dogs, etc., and their size is varied, such as small dogs, medium sized dogs, and large dogs. So there is a disadvantage that the device is not optimally worn in many cases.

Aforementioned technologies are intended to help a reader understand the background of the present invention, and should not be regarded as acknowledgement that they are already well known to those who skilled in this field of technology.

SUMMARY

The present invention is intended to provide an animal training device of which device body is separated into a plurality of modules that can be coupled to each other flexibly, thereby allowing an optimal contact by adjusting a degree of bending to fit the size of the animal being trained to be worn.

This invention is intended to provide an animal training device with improved wearability by separating and distributing functions of the device into a plurality of modules to reduce thickness, and with easy maintenance by enabling replacement and repair of only some of the failed modules.

Other objectives and advantages will be easily understood from the following description.

One embodiment of the present invention provides an animal training device. The animal training device for being worn on an animal being trained and for training by use of stimulus includes a device body, being worn on a neck of the animal being trained by a fastener, wherein the device body comprises a plurality of module bases in which a plurality of unit modules are respectively disposed, a body base having a plurality of compartments in which the plurality of unit modules are respectively disposed and at least one module connecting portion connecting two compartment, a plurality of module covers being respectively disposed on the plurality of module bases to form a space, PCB portion, being disposed in the space, and a contact terminal, being disposed on a part of the plurality of module covers.

In one embodiment, the module connecting portion may be made of a flexible material.

In one embodiment, the module connecting portion may have a corrugated structure.

In one embodiment, the plurality of unit modules may be at least one of a main module, a transformer module, and a battery module.

In one embodiment, the main module may include a main base corresponding to the module base, a main cover corresponding to the module cover, and a main PCB part corresponding to the PCB portion, wherein the main PCB part is configured for determining whether or not a predetermined condition is satisfied and generating a stimulus.

In one embodiment, the predetermined condition may be at least one of a bark sound exceeds a reference level, whether an animal has left the restricted area, or whether a user command is received through the remote controller.

In one embodiment, the stimulus is an output of electrical signal through the contact terminal.

In one embodiment, the transformer module may include a transformer base corresponding to the module base, a transformer cover corresponding to the module cover, and a transformer PCB part corresponding to the PCB portion, wherein a charger is in contact with the transformer module so that the transformer PCB part converts power from the charger to provide the converted power to the neighboring other unit modules.

In one embodiment, the transformer module may further include a first magnet disposed below the transformer cover, and the charger comprises a second magnet disposed on a surface to be in contact with the transformer module, wherein the charger is in contact with the transformer module by an interaction between the first magnet and the second magnet.

In one embodiment, the battery module may include a battery base corresponding to the module base, a battery cover corresponding to the module cover, and a battery PCB part corresponding to the PCB portion, wherein the battery PCB part includes a battery that is charged by power that is transferred from the neighboring other module or directly provided from a power cable.

In one embodiment, the battery PCB part may further include a vibration motor configured for generating stimulus that has predetermined characteristics under control of the main module.

Other aspects, features, and advantages will be more apparent from accompanying drawings, claims and detailed description.

According to embodiment of the present invention, it is advantageous that the animal training device can be separated into a plurality of modules that can be coupled to each other flexibly, thereby allowing an optimal contact by adjusting a degree of bending to fit the size of the animal being trained to be worn.

It is also advantageous that the wearability can be improved by separating and distributing functions of the device into a plurality of modules to reduce thickness, and the maintenance becomes easier by enabling replacement and repair of only some of the failed modules.

BRIEF DESCRIPTION OF ACCOMPANYING DRAWINGS

FIG. 1 is a perspective view of the animal training device according to one embodiment of the present invention;

FIG. 2 is an outer perspective view of the animal training device of which fastener is removed;

FIG. 3 is an inner perspective view of the animal training device of which fastener is removed;

FIG. 4 is an inside exploded perspective view of the animal training device;

FIG. 5 is an exploded perspective view of base;

FIG. 6 is an outer exploded perspective view of the animal training device;

FIG. 7 is a perspective view showing a charger electrically connected to the animal training device; and FIG. 8 illustrates the charger being connected.

DETAILED DESCRIPTION

The invention can be modified in various forms and specific embodiments will be described and shown below. However, the embodiments are not intended to limit the invention, but it should be understood that the invention includes all the modifications, equivalents, and replacements belonging to the concept and the technical scope of the invention.

If it is mentioned that an element is "connected to" or "coupled to" another element, it should be understood that still another element may be interposed therebetween, as well as that the element may be connected or coupled directly to another element. On the contrary, if it is mentioned that an element is "connected directly to" or "coupled directly to" another element, it should be understood that still another element is not interposed therebetween.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

Terms such as first, second, etc., may be used to refer to various elements, but, these elements should not be limited due to these terms. These terms will be used to distinguish one element from another element.

Terms such as~part,~unit,~module mean an element configured for performing a function or an operation. This can be implemented in hardware, software or combination thereof.

Elements of an embodiment described below with reference to the accompanying drawings are not limited to the corresponding embodiment, may be included in another embodiment without departing from the technical spirit of the invention. Although particular description is not made, plural embodiments may be embodied as one embodiment.

In describing the invention with reference to the accompanying drawings, like elements are referenced by like reference numerals or signs regardless of the drawing numbers and description thereof is not repeated. If it is determined that detailed description of known techniques involved in the invention makes the gist of the invention obscure, the detailed description thereof will not be made.

FIG. 1 is a perspective view of the animal training device according to one embodiment of the present invention.

The animal training device 100 according to one embodiment of the present invention is a collar-type device that can be worn on the neck of an animal being trained. The animal training device 100 according to the present embodiment may control (for example, correct, train) the behavior of animal being trained by outputting a predetermined stimulus (for example, electrical stimulus, vibration, etc.) in response to at least one of a barking detected in an embedded sensor (not shown), a command signal transmitted from a remote controller (not shown) owned by the user, or a signal generated when an animal being trained wearing the device leaves a restricted area.

The animal training device 100 includes a device body 110 that outputs stimulus to a skin of the animal being trained in contact, and a fastener 250 for attaching the device body 110 to the neck of the animal being trained in close contact with the skin.

The fastener 250 may include a strap 251 that is adjustable in length, and a buckle 252 that connects both ends of the strap 251 to form a closed curve. The strap 251 may be, for example, a nylon belt made of a nylon material. The buckle 252 may be made of, for example, a plastic material. The configuration and function of strap 251 and buckle 252 are well-known in this field, therefore detailed description will be omitted.

Hereinafter, the configuration and function of the animal training device 100 will be described in more detail with reference to the related drawings.

FIG. 2 is an outer perspective view of the animal training device of which fastener is removed, FIG. 3 is an inner perspective view of the animal training device of which fastener is removed, FIG. 4 is an inside exploded perspective view of the animal training device, FIG. 5 is an exploded perspective view of base, FIG. 6 is an outer exploded perspective view of the animal training device, FIG. 7 is a perspective view showing a charger electrically connected to the animal training device, and FIG. 8 illustrates the charger being connected.

The animal training device 100 according to one embodiment of the present invention is worn on the neck of the animal being trained by the fastener 250, and when a predetermined condition is satisfied, the animal training device 100 may apply stimulus through a terminal in contact with the skin of the animal being trained to inhibit or induce the behavior of the animal being trained to train.

The predetermined condition may be at least one of whether a bark sound exceeds a reference level, whether an animal has left the restricted area, or whether a user command is received through the remote controller.

Hereinafter, with respect to the animal training device 100 shown in the drawings, a direction or a surface facing the skin of the animal being trained is referred to as an inner side, and a direction or a surface opposite to the inner portion is referred to as an outer portion.

The animal training device 100 includes the device body 110 in contact with the skin (especially, neck skin) of the animal being trained by the fastener 250.

The device body 110 may include three unit modules. In the present embodiment, the number of unit modules 3 is exemplary, and it is obvious that the device body 110 may be divided into two unit modules or four or more unit modules, if necessary.

Assuming that the device body 110 includes three unit modules, the device body 110 may include a main module 210, a transformer module 220, and a battery module 230.

The main module 210 is provided with a controller configured for determining whether a condition is satisfied and generating a stimulus corresponding to the determination result.

The transformer module 220 is connected to the charger 300 to convert power to be used in each of components of the animal training device 100.

The battery module 230 is provided with a battery, and charges and stores the power converted by the transformer module 220.

The device body 110 includes a body base 111 having a structure extending in one direction, so that each unit module can be integrally disposed thereon.

The body base 111 may include three compartments, and each unit module described above may be disposed one by one in each compartment. In the drawing, a case in which the main module 210, the transformer module 220, and the battery module 230 are arranged in the order is illustrated.

A module base 112 configured to form a space for installation of each unit module may be disposed on the inner side of the body base 111. The module base 112 may include a main base 211, a transformer base 221, and a battery base 231.

The module base 112 and the body base 111 are shaped to be convexly rounded toward the outer side, and thus, it is possible to provide an improved contact when worn due to the shape similar to the circumference of the neck of the animal being trained.

Module connecting portion 113 is located between two module bases 112, for example, between the main module 210 and the transformer module 220, and between the transformer module 220 and the battery module 230. Since the module connecting portion 113 has a corrugated structure, it may be bent by an external force.

The body base 111 may be made of a flexible material, so that the module connecting portion 113 can be easily bent. Therefore it becomes possible to provide the improved contact by adjusting the degree of bending according to the size of the animal being trained and arranging each unit module to have an optimized curvature around the neck of the animal being trained.

Components (PCB portions) corresponding to each unit module are mounted on the module base 112, and a module cover 114 is disposed thereon to protect the components. The module cover 114 may include a main cover 212, a transformer cover 222, and a battery cover 232.

According to its position, some of the module cover 114 may have a first contact terminal 115 and a second contact terminal 116 disposed on the surface. In the present embodiment, the first contact terminal 115 and the second contact terminal 116 may be disposed respectively on the main module 210 and the battery module 230 spaced apart from each other with the transformer module 220 interposed therebetween.

The contact terminals 115, 116 contact directly the skin of the animal being trained, and configured for applying stimulus that the main module 210 generates to the animal being trained. For example, the contact terminals 115, 116 may be electrodes, and the stimulus may be an electrical signal having predetermined characteristics (e.g., intensity, frequency, etc.).

An O-ring 1141 may be disposed between the module base 112 and the module cover 114. The O-ring 1141 is disposed at the part where the module base 112 and the module cover 114 are assembled, thereby preventing foreign substances (for example, dust, moisture, animal hair, etc.) from being introduced into the unit module.

Hereinafter, configurations and functions of each module will be described.

The main module 210 includes the main base 211 and the main cover 212.

The main PCB part 213 may be disposed in a space between the main base 211 and the main cover 212. The main PCB part 213 may perform a communication with the remote controller to receive a user command, determine whether the predetermined condition is satisfied, and cause the predetermined stimulus to be generated through the contact terminals 115, 116 according to the determination result.

The main PCB part 213 may include a main PCB 2131 corresponding to the controller configured for determining whether the predetermined condition is satisfied and generating stimulation, and an antenna 2132 for communicating with the remote controller. The antenna 2132 may be, for example, a coil antenna. A bracket 2133 for stably supporting the antenna 2132 may be provided on the main PCB 2131.

Alternatively, the main PCB part 213 may be provided with a sensor to sense and identify the barking sound of the animal being trained wearing the device.

Alternatively, the main PCB part 213 may be provided with a location finder such as GPS, and may determine whether or not the restricted area has been deviated based on the current location of the animal being trained.

The first electrode insert 214 may be protruded from the main cover 212. The first electrode insert 214 is a part for coupling the first contact terminal 115 and is electrically connected to the first contact terminal 115 to output electrical stimulus to the outside.

The transformer module 220 includes the transformer base unit 221 and the transformer cover unit 222.

A transformer PCB part 223 may be disposed in a space between the transformer base unit 221 and the transformer cover unit 222. The transformer PCB 223 may convert the high voltage commercial power transmitted through the charger 300 into a rated voltage that enables each component in the animal training device 100 to operate.

The transformer PCB part 223 may include a transformer PCB 2231 configured for transferring power and electric signals to other PCBs (main PCB 2131, battery PCB 2231), and an H transformer 2232 configured for converting high voltage to low voltage.

The transformer PCB 2231 is a part that connects each unit module and may be a flexible PCB. Accordingly, when the device body 110 is bent according to the size of the animal being trained, even if the transformer PCB 2231 is flexibly bent, power and electrical signals can be transmitted.

A charging terminal 224 may be provided on the surface of the transformer cover 222. The charging terminal 224 may be supplied with power by contacting power supply terminals 311 provided in the charger 300.

The charger 300 is a device that supplies power so that the animal training device 100 operates normally. The charger 300 is coupled to the transformer module 220 to supply power for charging.

The charger 300 may include a charger body 310 having a shape corresponding to an external shape of the transformer module 220, in particular, the external shape of the transformer cover 222. Accordingly, the charger body 310 of the charger 300 may be matched to the transformer module 220.

For easy detachment of the charger 300, a first magnet 225 may be disposed in the transformer module 220, and a second magnet 320 may be disposed in the charger body 310 of the charger 300. That is, the second magnet 320 may be disposed on the contact surface of the charger 300.

Even if there is no external force, the charger 300 may maintain contact with the transformer module 220 due to magnetic force (especially attractive force) between the first magnet 225 and the second magnet 320. And when there is an external force, the charger 300 can be easily separated from the transformer module 220.

As another unit module of the animal training device 100, the battery module 230 includes the battery base 231 and the battery cover 232.

A battery PCB part 233 may be disposed in a space between the battery base 231 and the battery cover 232. The battery PCB part 233 may receive the converted power from the transformer module 220 and charge the battery 2332, and supply the charged power to each of the components during the normal operation of the animal training device 100.

The battery PCB part 233 includes a battery PCB 2331 and a battery 2332. In addition, the battery PCB part 233 may further include a vibration motor 2333. The vibration motor 2333 is a means for generating vibration, which is one of stimuli for the animal being trained. When vibration generation is required corresponding to a stimulus output signal transmitted from the above-described main module 210, the vibration motor 2333 may operate to generate vibration having a predetermined characteristic. The vibration characteristic may include at least one of intensity, period, and duration.

In addition, a second electrode insert 234 may be protruded from the battery cover 232. The second electrode insert 234 is a part for coupling the second contact terminal 116 and is electrically connected to the second contact terminal 116 to output stimulus to the outside.

The first contact terminal 115 and the second contact terminal 116 may have interchangeable structures. Therefore, it is possible to increase the fidelity of animal training by coupling contact terminals having a size, shape, and material determined according to the animal being trained and/or the characteristics of the training to the first electrode insert 214 and the second electrode insert 234.

An LED 235 for displaying the state of the animal training device 100 may be disposed on the battery cover 232. For example, the LED 235 is turned off during not operating, the green light is emitted during normal operation, and the red light is emitted when the battery is low or an error occurs.

In addition, a power terminal 236 for receiving power through a power cable having a power jack may be disposed on the battery cover 232.

The device body 110 of the animal training device 100 may be provided with a hook part 240 on the outer side. The hook part 240 may include a center hook 240a disposed at the center of the device body 110 and side hooks 240b disposed at both left and right ends.

The hook part 240 has a U-shape, and thus a space through which the strap 251 can pass may be formed between the device body 110, particularly the outer surface of the body base 111. The device body 110 is movably disposed on the inner side of the strap 251 by the hook part 240, and when the strap 251 is fastened to the neck of the animal being trained, the device body 110 may be in close contact with the skin of the neck.

In the present embodiment, it has been described on the assumption that the body base 111 is integrally configured. In another embodiment, a portion corresponding to the module base may be separated, and may have a structure in which they are assembled and fastened together.

In this case, an animal training device with an adaptive function can be manufactured by individually manufacturing various unit modules and then selecting and assembling unit modules having a required function according to the animal being trained and/or the characteristics of the training.

A module connecting portion having a corrugated structure is arranged between the unit modules, so that it is possible to bend with a high degree of freedom when assembled.

In this case, a flexible PCB circuit capable of transmitting power and electric signals between neighboring unit modules may be implemented at the module connecting portion.

While the invention has been described above with reference to exemplary embodiments, it will be understood by those skilled in the art that the invention can be modified and changed in various forms without departing from the concept and scope of the invention described in the appended claims.

What is claimed is:

1. An animal training device for being worn on an animal being trained and for training by use of stimulus, comprising:
    a device body, being worn on a neck of the animal being trained by a fastener,
    wherein the device body comprises:
        a plurality of module bases in which a plurality of unit modules are respectively disposed,
        a body base having a plurality of compartments in which the plurality of unit modules are respectively disposed and at least one module connecting portion connecting two compartments,
        a plurality of module covers being respectively disposed on the plurality of module bases to form a space,
        PCB portion, being disposed in the space, and
        a contact terminal, being disposed on a part of the plurality of module covers.

2. The animal training device of claim 1, wherein the module connecting portion is made of a flexible material.

3. The animal training device of claim 1, wherein the module connecting portion has a corrugated structure.

4. The animal training device of claim 1, wherein the plurality of unit modules is at least one of a main module, a transformer module, and a battery module.

5. The animal training device of claim 4, wherein the main module comprises:
    a main base corresponding to the module base;
    a main cover corresponding to the module cover; and
    a main PCB part corresponding to the PCB portion,
    wherein the main PCB part is configured for determining whether or not a predetermined condition is satisfied and generating a stimulus.

6. The animal training device of claim 5, wherein the predetermined condition is at least one of a bark sound exceeds a reference level, whether an animal has left the restricted area, or whether a user command is received through the remote controller.

7. The animal training device of claim 5, wherein the stimulus is an output of electrical signal through the contact terminal.

8. The animal training device of claim 4, wherein the transformer module comprises:
   a transformer base corresponding to the module base;
   a transformer cover corresponding to the module cover; and
   a transformer PCB part corresponding to the PCB portion,
   wherein a charger is in contact with the transformer module so that the transformer PCB part converts power from the charger to provide the converted power to the neighboring other unit modules.

9. The animal training device of claim 8, wherein the transformer module further comprises a first magnet disposed below the transformer cover, and the charger comprises a second magnet disposed on a surface to be in contact with the transformer module, wherein the charger is in contact with the transformer module by an interaction between the first magnet and the second magnet.

10. The animal training device of claim 4, wherein the battery module comprises:
    a battery base corresponding to the module base;
    a battery cover corresponding to the module cover; and
    a battery PCB part corresponding to the PCB portion,
    wherein the battery PCB part comprise a battery that is charged by power that is transferred from the neighboring other module or directly provided from a power cable.

11. The animal training device of claim 10, wherein the battery PCB part further comprises a vibration motor configured for generating stimulus that has predetermined characteristics under control of the main module.

* * * * *